(12) United States Patent
Nakashiba

(10) Patent No.: US 7,545,025 B2
(45) Date of Patent: Jun. 9, 2009

(54) SEMICONDUCTOR DEVICE

(75) Inventor: Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/040,952

(22) Filed: Mar. 3, 2008

(65) Prior Publication Data
US 2008/0211067 A1    Sep. 4, 2008

(30) Foreign Application Priority Data
Mar. 1, 2007    (JP) .............................. 2007-051728

(51) Int. Cl.
*H01L 23/552*    (2006.01)
(52) U.S. Cl. .................. 257/659; 257/422; 257/629; 257/630; 257/E23.114
(58) Field of Classification Search .............. 257/659, 257/E23.114, 409, 422, 629, 630, 660; 439/607; 438/731
See application file for complete search history.

(56) References Cited

U.S. PATENT DOCUMENTS

| | | | | |
|---|---|---|---|---|
| 6,944,025 B2 * | 9/2005 | Hockanson et al. | ......... | 361/719 |
| 7,045,881 B2 * | 5/2006 | Hagen et al. | ................. | 257/659 |
| 7,233,055 B2 * | 6/2007 | Grange | ........................ | 257/659 |
| 7,405,477 B1 * | 7/2008 | Tao et al. | ..................... | 257/728 |

FOREIGN PATENT DOCUMENTS

| | | |
|---|---|---|
| JP | 02-702660 A | 3/1990 |
| JP | 2002-198490 A | 7/2002 |
| JP | 2004-095777 A | 3/2004 |
| JP | 2006-059959 A | 3/2006 |

OTHER PUBLICATIONS

Ali Hajimiri et al., "Design Issues in CMOS Differential LC Oscillators", IEEE Journal of Solid-State Circuits, vol. 34, No. 5, May 1999, pp. 717-724.

* cited by examiner

*Primary Examiner*—Jasmine J Clark
(74) *Attorney, Agent, or Firm*—Young & Thompson

(57) ABSTRACT

Disclosed is a semiconductor device which includes a semiconductor chip and a base substrate. The semiconductor chip includes a semiconductor substrate, an interconnect layer and a high-frequency interconnect. The interconnect layer is provided on the substrate. The high-frequency interconnect is formed within the interconnect layer. The semiconductor chip is mounted onto the base substrate. An electromagnetic shield layer is provided between the high-frequency interconnect and the interconnect.

11 Claims, 7 Drawing Sheets

US 7,545,025 B2

SEMICONDUCTOR DEVICE

This application is based on Japanese patent application No. 2007-051728, the content of which is incorporated herein by reference.

BACKGROUND

1. Technical Field

The present invention relates to a semiconductor device.

2. Related Art

FIG. 6 is a cross-sectional view of a conventional semiconductor device. A semiconductor device 100 includes a semiconductor chip 110 and a base substrate (or a build-up substrate) 130. The semiconductor chip 110 includes a substrate 112 and an interconnect layer 114 provided thereon. A high-frequency interconnect 116 is formed within the interconnect layer 114. The high-frequency interconnect 116 functions as an inductor. Further, pads 118 are formed on the interconnect layer 114.

Such semiconductor chip 110 is flip-chip mounted on the base substrate 130. More specifically, the semiconductor chip 110 is mounted face down (hence, "flipped") onto the base substrate 130 via bumps 120. Pads 132 are formed on an upper surface of the base substrate 130. Further, interconnects 134 are formed within the base substrate 130.

Prior art documents related to the present invention are, for example, Japanese Patent Application Publication No. 2002-198490, Japanese Patent Application Publication No. 1990 (H02)-72660, Japanese Patent Application Publication No. 2006-59959, Japanese Patent Application Publication No. 2004-95777, and the non-patent literature document: Ali Hajimiri et al., entitled "Design Issues in CMOS Differential LC Oscillators", IEEE JOURNAL OF SOLID-STATE CIRCUITS, Vol. 34, No. 5, May 1999, pp. 717-724.

In the semiconductor device 100 of FIG. 6, however, a magnetic field caused by the high-frequency interconnect 116 induces an eddy current in the associated pads 118 that are disposed under the high-frequency interconnect 116. Then, a magnetic field is induced by Lenz's Law in a direction such that the induced magnetic field opposes the original magnetic field. This causes a variation in the circuit constant of the high-frequency interconnect 116.

A possible approach to such problem is to eliminate the pads 118 from the underneath of the high-frequency interconnect 116, as shown in FIG. 7. This approach can prevent the induction of the eddy current in the pads 118 due to the magnetic field caused by the high-frequency interconnect 116.

However, an eddy current is induced by the generation of the magnetic field caused by the high-frequency interconnect 116, not only in the pads 118 but also in the base substrate 130. The induced eddy current in the interconnects 134 can also be naturally a factor for the variation in the circuit constant of the high-frequency interconnect 116. Such problem is considerably exhibited when the semiconductor chip 110 is mounted face down onto the base substrate 130. This is because a distance between the high-frequency interconnect 116 and the base substrate 130 is shorter than when the semiconductor chip 110 is mounted face up onto the base substrate 130. With the downsizing of the bump 120 in recent years, the distance becomes short, thus causing such a problem.

Further, Since there can be different spatial relationships for their respective possible base substrates 130 between the high-frequency interconnects 116 and the interconnects 134, the degree of deterioration in the transmission characteristics due to the eddy current in the interconnects 134 can be changed, depending on the type of the base substrate 130 (more specifically, the arrangement of the interconnects 134 in the base substrate 130). Therefore, in order to prevent the considerable variation in the transmission characteristics of the high-frequency interconnect 116, regardless of which the type of the base substrate 130 is selected, it is important to inhibit the influence of the eddy current in the interconnects 134.

SUMMARY

According to the present invention, there is provided a semiconductor device which comprises: a base substrate including an interconnect and a semiconductor chip mounted onto the base substrate. The semiconductor chip has a circuit-forming surface positioned to face the base substrate. The semiconductor chip includes: a substrate; an interconnect layer provided over the substrate; and a high-frequency interconnect provided in the interconnect layer. An electromagnetic shield layer is provided between the high-frequency interconnect and the interconnect of said base substrate.

In the semiconductor device according to the present invention, the electromagnetic shield layer is provided between the high-frequency interconnect and the interconnect of the base substrate. Thus, even if an eddy current is induced in the interconnect of the base substrate, the semiconductor device is capable of limiting an influence caused by the eddy current over the high-frequency interconnect.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

Figure 1:
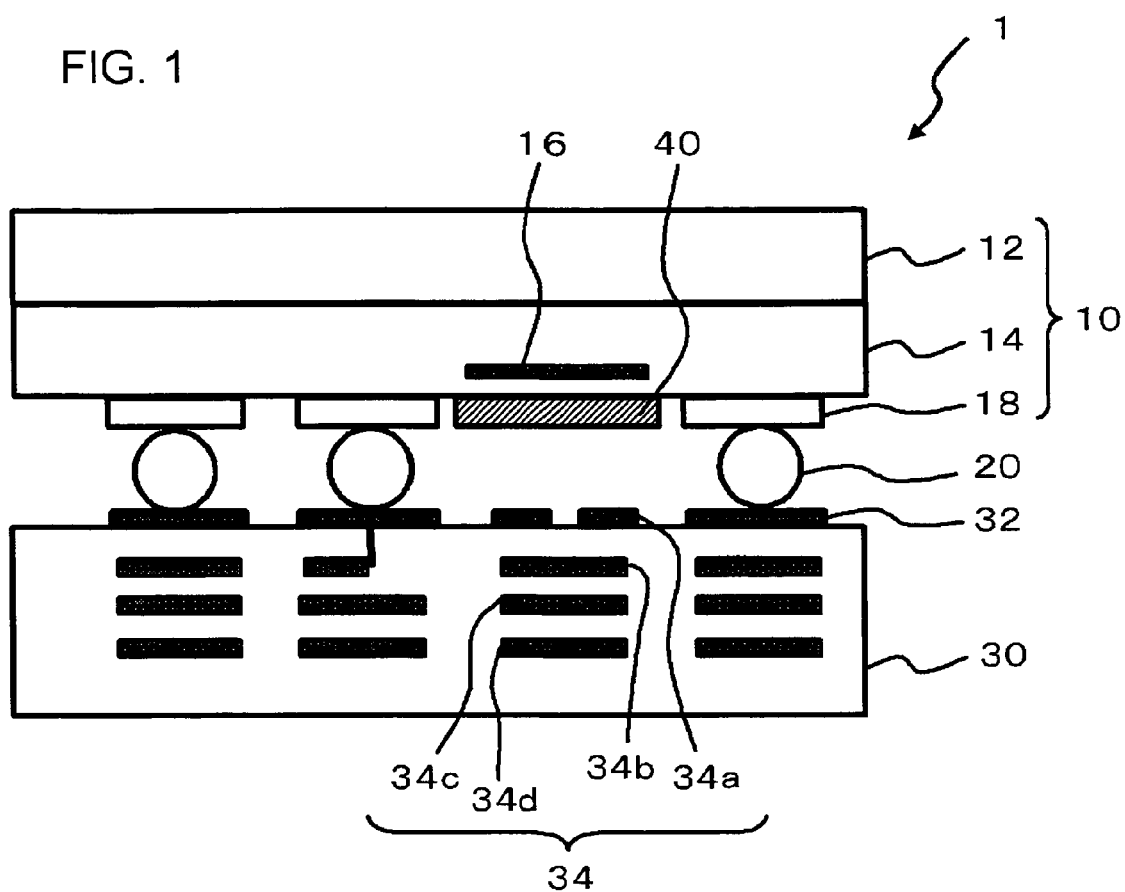
FIG. 1 is a cross-sectional view of an embodiment of a semiconductor device according to the present invention.

The invention will be now described herein with reference to illustrative embodiments. Those skilled in the art will recognize that many alternative embodiments can be accomplished using teachings of the present invention, and that the present invention is not limited to the illustrative embodiments described for explanatory purposes.

Exemplary embodiments according to the present invention will now be described with reference to the accompanying drawings. It is understood that identical elements in the different figures are referred to by the same reference numeral, and the detailed description will not be repeated.

FIG. 1 is a cross-sectional view of an embodiment of a semiconductor device according to the present invention. A semiconductor device 1 includes a semiconductor chip 10 and a base substrate 30. The semiconductor chip 10 includes a semiconductor substrate 12, an interconnect layer 14 and a high-frequency interconnect 16. The semiconductor substrate 12 can be, for example, a silicon substrate. The interconnect layer 14 is provided on the substrate 12. The high-frequency interconnect 16 is formed in the interconnect layer 14. An electric current having a frequency of, for example, 5 GHz or higher, flows through the high-frequency interconnect 16. In the present embodiment, the high-frequency interconnect 16 is formed to have an electric coil-shape, so that the high-frequency interconnect 16 can function as an inductor. Further, electroconductive pads 18 are provided on the interconnect layer 14. The pads 18 are arranged in regions which do not overlap with the high-frequency interconnect 16 in their plan view.

This semiconductor chip 10 is flip-chip mounted over the base substrate 30. More specifically, the semiconductor chip 10 is mounted face down onto the base substrate 30 via bumps 20. Namely, the semiconductor chip 10 has a circuit-forming surface positioned to face the base substrate 30. The bumps 20 are also arranged in regions which do not overlap with the high-frequency interconnect 16 in their plan view, which is similar to the arrangement of the pad 18. The bump 20 is, for example, a solder bump or a gold bump. The bumps 20 function as electrode terminals of the semiconductor device 1.

The base substrate 30 includes interconnects 34, and electroconductive pads 32 are provided on an upper surface of the base substrate 30. The base substrate 30 is, for example, a printed circuit board or a silicon interposer. Alternatively, the base substrate 30 can be a semiconductor chip that is different from the semiconductor chip 10.

The interconnects 34 in the base substrate 30 is configured to be a multi-layered interconnect structure comprised of interconnects 34a, 34b, 34c and 34d. The interconnect 34a is an interconnect that serves as the uppermost layer, and is disposed at the same layer level as the pads 32. The interconnect 34b is disposed at the layer level that is lower than the layer level of the interconnect 34a by one level. Similarly, the interconnect 34c is disposed at the layer level that is lower than that of the interconnect 34b by one level. The interconnect 34d is disposed at the layer level that is lower than that of the interconnect 34c by one level.

An electromagnetic shield layer 40 is provided between the high-frequency interconnect 16 and the interconnects 34. The electromagnetic shield layer 40 has a conductor pattern to be applied with a constant electric potential. It is preferable that the constant electric potential is a ground potential. In the present embodiment, the electromagnetic shield layer 40 is provided on the semiconductor chip 10. More specifically, the electromagnetic shield layer 40 is provided on the interconnect layer 14 of semiconductor chip 10. In other words, the electromagnetic shield layer 40 is disposed at the same layer level as the pads 18. Further, the electromagnetic shield layer 40 can be formed of the same material as the pads 18. A typical material used for both the pad 18 and the electromagnetic shield layer 40 can be, for example, aluminum.

In the present embodiment, the electromagnetic shield layer 40 is provided only between the high-frequency interconnect 16 and the interconnects 34. More specifically, no electromagnetic shield layer is provided in one side (of the semiconductor chip 10) that is opposite to the other side (i.e., an upper portion in FIG. 1), in which the electromagnetic shield layer 40 is formed, with respect to the high-frequency interconnect 16. Further, no electromagnetic shield layer is provided on the lateral sides to the high-frequency interconnect 16.

Figure 2:
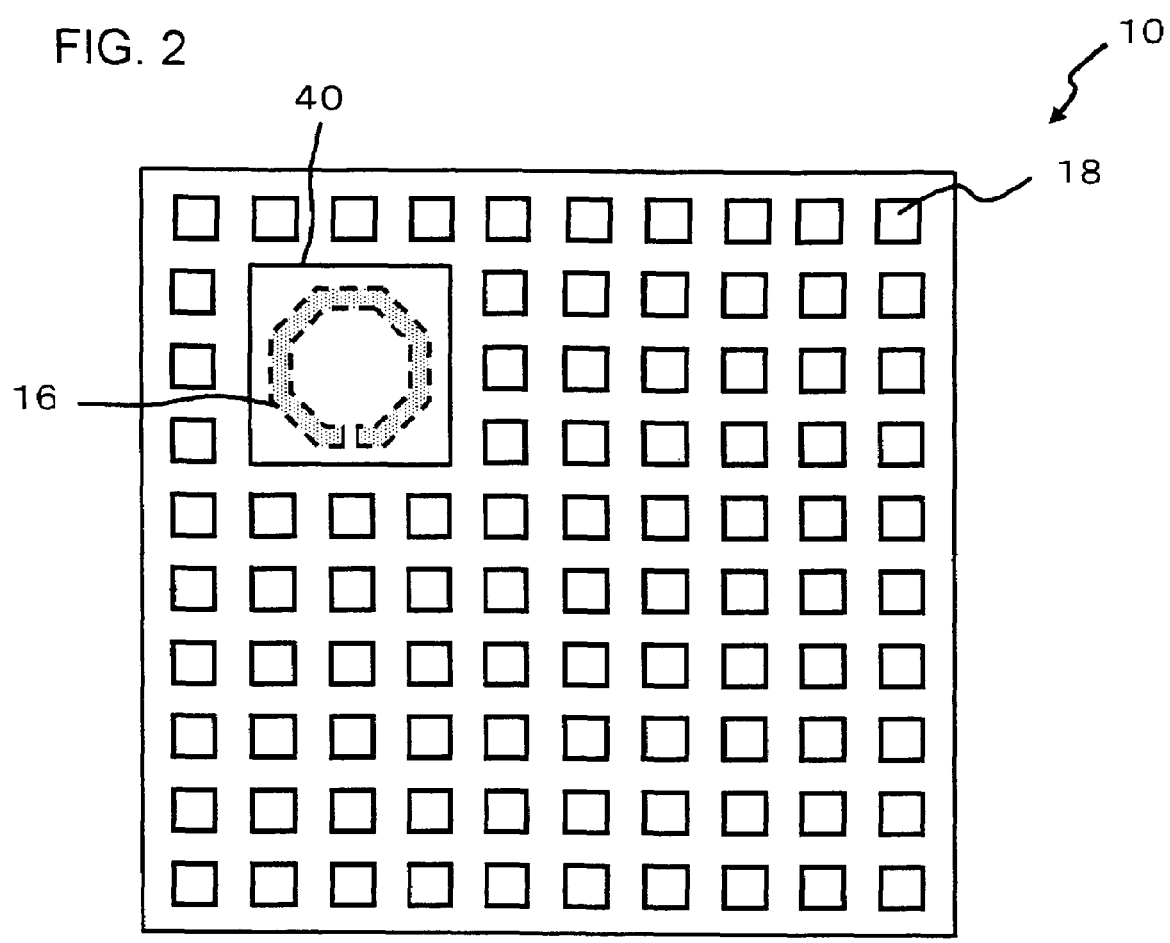
FIG. 2 is a plan view of a semiconductor chip of the semiconductor device shown in FIG. 1.

FIG. 2 is a simplified plan view of the semiconductor chip 10. As can be seen from FIG. 2, the pads 18 can be regularly or periodically arranged in their plan view, except in a region overlapping with the high-frequency interconnect 16. The pads 18 form a tetragonal lattice pattern in the present embodiment. Further, the electromagnetic shield layer 40 has a flat plate-shaped geometry without having any opening, and covers the whole of an upper portion of the high-frequency interconnect 16 (where the upper portion indicates the portion seen on the lower side of the interconnect layer 14 illustrated in FIG. 1).

Advantageous effects of the present embodiment will be described. In the semiconductor device 1, the electromagnetic shield layer 40 is provided between the high-frequency interconnect 16 and the interconnects 34 of the base substrate 30. Thus, even if an eddy current is induced in the interconnects 34 of the base substrate 30, the semiconductor device 1 is capable of limiting an influence caused by the eddy current over the high-frequency interconnect, over the high-frequency interconnect 16.

Figure 3:
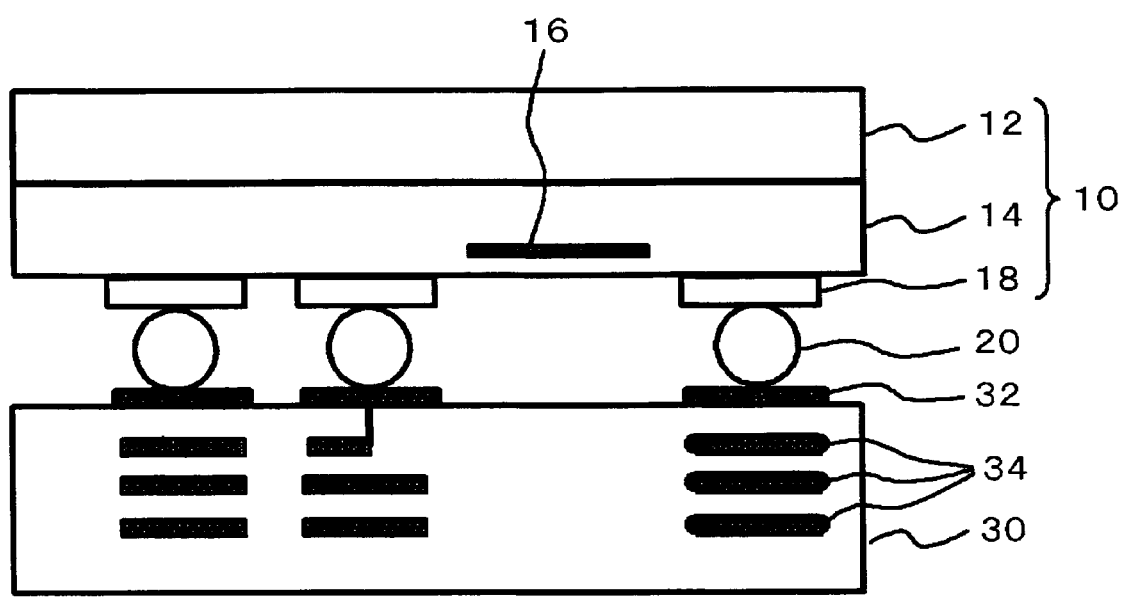
FIG. 3 is a cross-sectional view of a comparative example for comparison with the embodiment.

On the contrary, a possible approach for reducing the influence of the eddy current in the interconnects 34 over the high-frequency interconnect 16 is, as shown in FIG. 3, to eliminate the interconnects 34 from the region that is opposite to the the high-frequency interconnect 16 with respect to the lower surface of the interconnect layer 14 (i.e., the region that overlaps with the high-frequency interconnect 16 in its plan view). Namely, the possible approach is to eliminate the interconnects 34 from the inside of the base substrate 30. However, such an approach leads to a decrease in design flexibility for the base substrate 30. Otherwise, when an existing substrate member is employed for the base substrate 30 of the present embodiment, the possible approach reduces the selectivity of the substrate member. Therefore, it is preferable to provide electromagnetic shield layer 40 between the high-frequency interconnect 16 and the interconnects 34 as described above (in connection with the present embodiment), thereby to limit the influence of the eddy current in the interconnects 34 over the high-frequency interconnect 16.

Further, the electromagnetic shield layer 40 is provided in the semiconductor chip 10. This improves design flexibility for the base substrate 30, as compared with when the electromagnetic shield layer 40 is provided in the base substrate 30.

On the other hand, an eddy current can be induced in the electromagnetic shield layer 40 by the generation of the magnetic field caused by the high-frequency interconnect 16. There is a possibility that the induced eddy current is a cause of changing of the circuit constant of the high-frequency interconnect 16. However, in order to reduce variation in transmission characteristics of the high-frequency interconnect 16 and to stabilize the transmission characteristics, it is more important to limit the influence of the eddy current of the interconnects 34 in the base substrate 30, rather than limiting the influence of the eddy current of electromagnetic shield layer 40 to improve the design flexibility for the base substrate 30. The reason is as follows.

Since the spatial relationship between the electromagnetic shield layer 40 and the high-frequency interconnect 16 can be specified and not be changed, the amount of deterioration in the transmission characteristics due to the eddy current in the electromagnetic shield layer 40 can be constant for any type of the substrate. On the other hand, since the spatial relationship between the high-frequency interconnect 16 and the interconnects 34 depends on the configuration of the base substrate 30, the amount of deterioration in the transmission characteristics due to the eddy current in the interconnects 34 depends on the configuration of the base substrate 30 (more specifically, depends on an arrangement of the interconnects 34 of the base substrate 30). Therefore, in order to prevent the considerable variation in the transmission characteristics of the high-frequency interconnect 16, regardless of which type of the base substrate 30 is selected, it is important to inhibit the influence of the eddy current in the interconnects 34.

It is preferable to dispose the electromagnetic shield layer 40 only in a region necessary for the limitation of the influence of the eddy current in the interconnects 34 over the high-frequency interconnect 16. Taking such technical aspect into consideration, in the present embodiment described above, the electromagnetic shield layer 40 is provided only between the high-frequency interconnect 16 and the interconnects 34.

As described above, the electromagnetic shield layer 40 is disposed at the same layer level as the pads 18, and is formed of the same material as the pads 18, or of one or more of the component materials constituting the pad 18. Thus, the electromagnetic shield layer 40 and the pads 18 can be formed simultaneously in the same process, thus allowing formation of the electromagnetic shield layer 40 without a need for an additional manufacturing process.

Furthermore, the high-frequency interconnect 16 can be an inductor. When the above-described eddy current is generated thereby to induce a magnetic field in the inductor in a direction such that the induced magnetic field opposes the original magnetic field, the resultant intensity of the magnetic field in the inductor be decreased. The decrease in the resultant intensity causes a variation in the Q value of the inductor. On the contrary, according to the configuration of the present embodiment, a variation in the Q value of the inductor is reduced to provide a stabilized Q value, thereby providing an improved design flexibility for the base substrate 30.

The above-described problem, more specifically, the problem of the change in the circuit constant of the high-frequency interconnect by the eddy current in the interconnect of the base substrate becomes more prominent when an electric current having a frequency of 5 GHz or higher flows through the high-frequency interconnect. Further, such problem also becomes more prominent when heights of bumps between the base substrate and the semiconductor chip are equal to or lower than 100 fÊm. This is because such bumps provides a very short distance between the high-frequency interconnect and the base substrate. Therefore, when such bumps are employed, an usability of the present embodiment, which provides a reduced influence of the eddy current in the interconnects 34 of the base substrate 30 over the high-frequency interconnect 16, is particularly increased.

Figure 4:
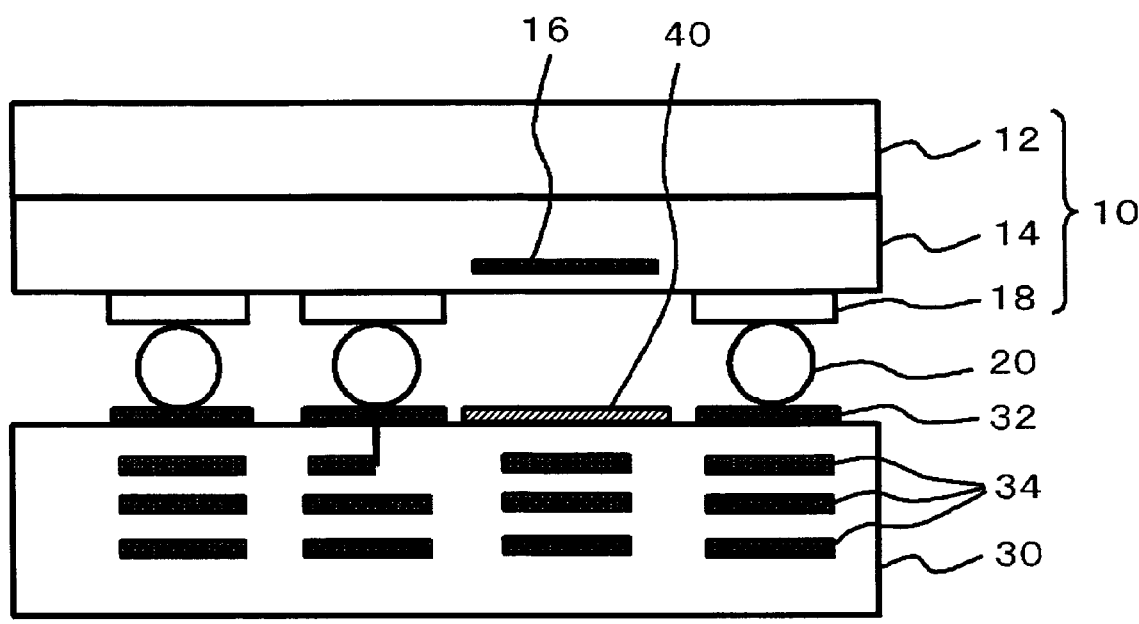
FIG. 4 is a cross-sectional view illustrating a modification of the embodiment according to the present invention.
Figure 5:
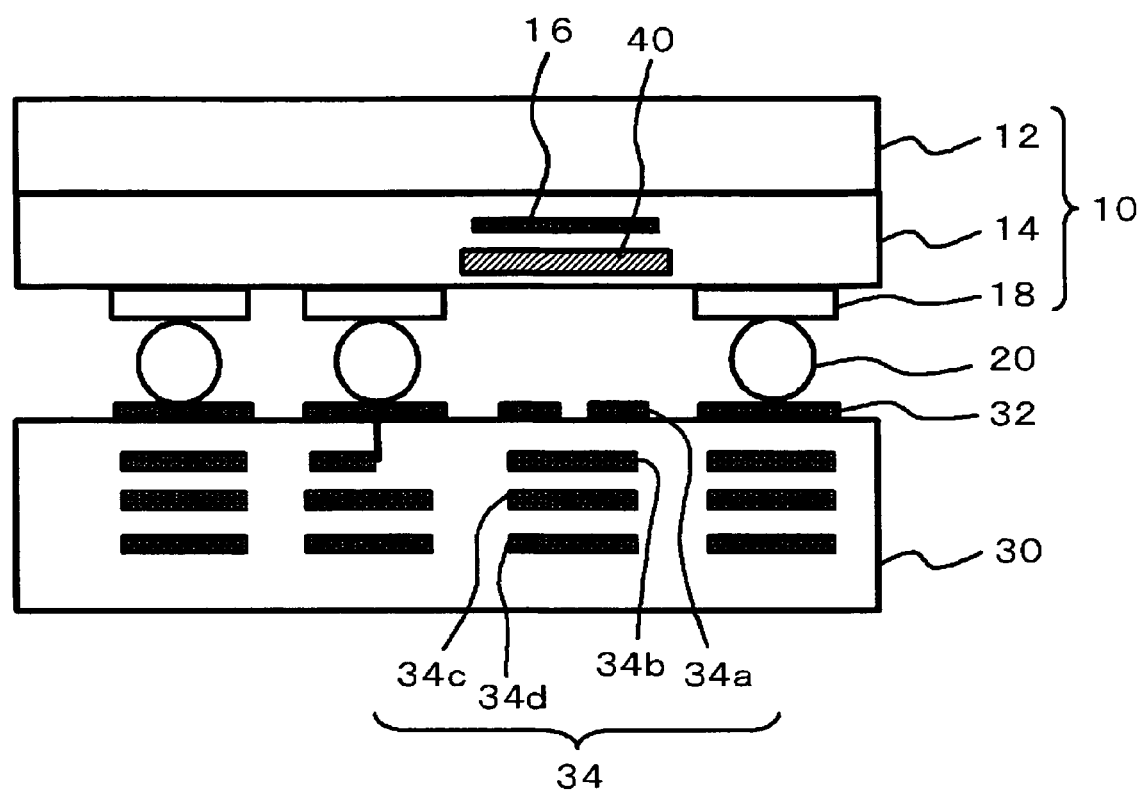
FIG. 5 is a cross-sectional view illustrating a modification of the embodiment according to the present invention.
Figure 6:
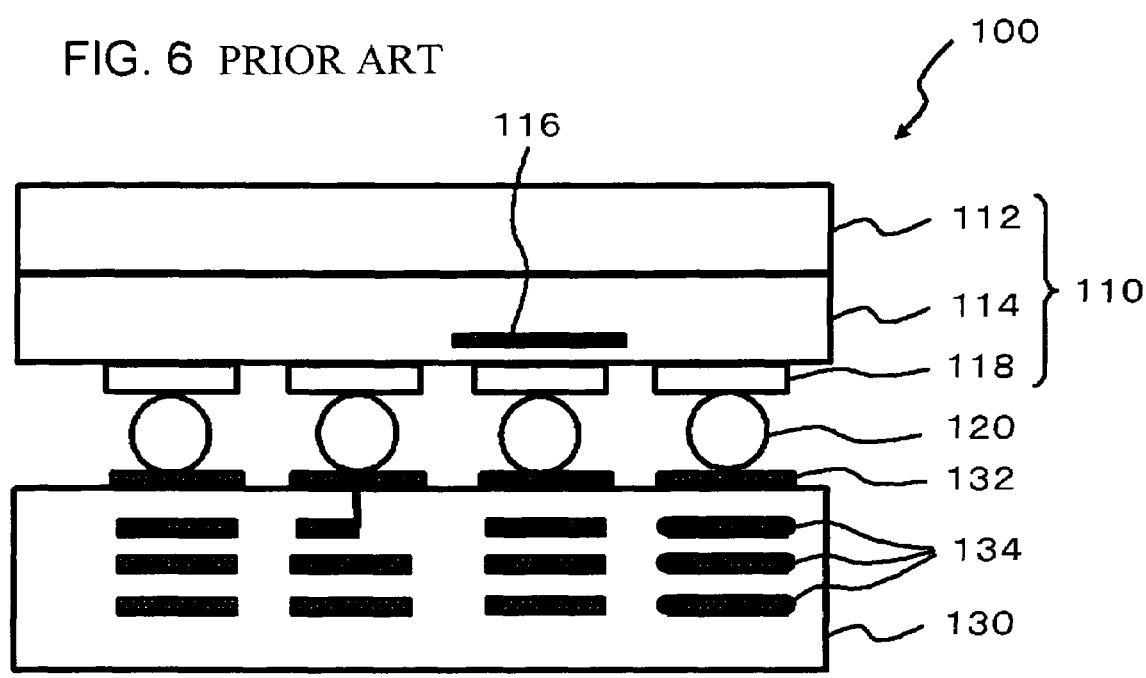
FIG. 6 is a cross-sectional view of a conventional semiconductor device.
Figure 7:
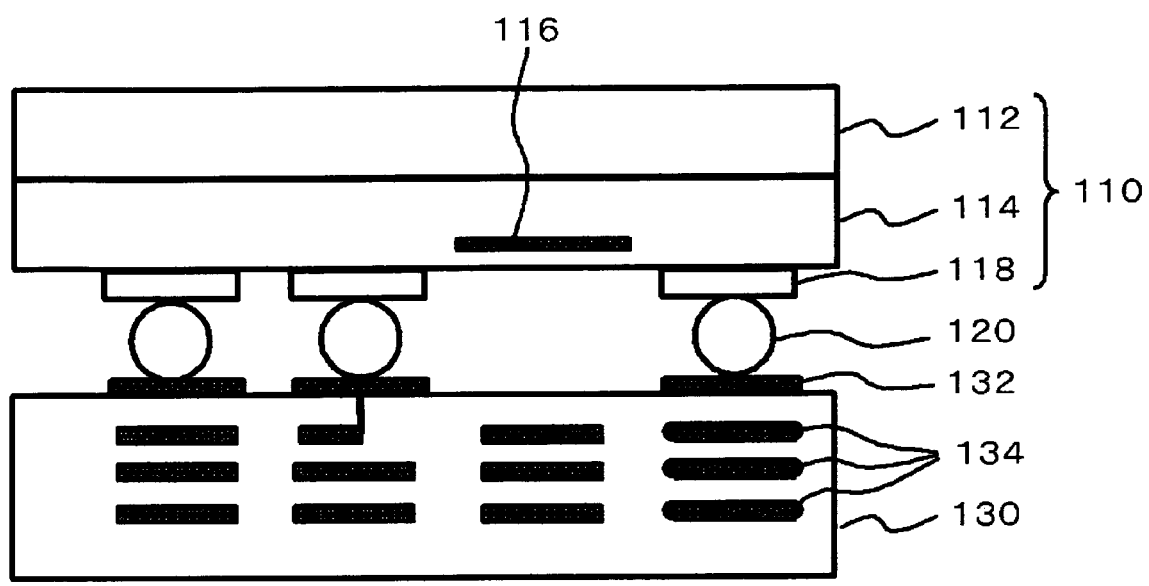
FIG. 7 is a cross-sectional view for describing a problem to be solved by the present invention.

The present invention is not limited to the above-described embodiment, and various modifications thereof may also be employed. In the above-described embodiment, the exemplary implementation of the electromagnetic shield layer 40, which is provided on the interconnect layer 14, is illustrated. However, the location of the electromagnetic shield layer 40 may not be limited to the above-described location, and may be disposed in any location, as long as it is located between the high-frequency interconnect 16 and interconnects 34. For example, as shown in FIG. 4, the electromagnetic shield layer 40 can be disposed on one surface of the base substrate 30. In FIG. 4, the electromagnetic shield layer 40 is provided at the same layer level as the pads 32. Alternatively, as shown in FIG. 5, the electromagnetic shield layer 40 can be formed within the interconnect layer 14.

Further, while the high-frequency interconnect 16 is exemplified to be an inductor in the above-described embodiment, the high-frequency interconnect 16 can be an ordinary high-frequency interconnect.

It is apparent that the present invention is not limited to the above embodiment, and may be modified and changed without departing from the scope and spirit of the invention.

What is claimed is:

1. A semiconductor device comprising:
a base substrate including an interconnect; and
a semiconductor chip mounted onto said base substrate and having a circuit-forming surface positioned to face said base substrate, said semiconductor chip including: a substrate; an interconnect layer provided over said substrate; and a high-frequency interconnect provided in said interconnect layer,
wherein an electromagnetic shield layer is provided between said high-frequency interconnect and said interconnect of said base substrate.

2. The semiconductor device as set forth in claim 1, wherein said high-frequency interconnect is an interconnect which is applied with an electric current having a frequency equal to or greater than 5 GHz.

3. The semiconductor device as set forth in claim 1, wherein said high-frequency interconnect functions as an inductor.

4. The semiconductor device as set forth in claim 1, wherein:
said semiconductor chip includes a first electroconductive pad provided over said interconnect layer; and
said electromagnetic shield layer is disposed at a same layer level as said first electroconductive pad.

5. The semiconductor device as set forth in claim 4, wherein said electromagnetic shield layer is formed of a same material as said first electroconductive pad.

6. The semiconductor device as set forth in claim 1, wherein said electromagnetic shield layer is provided only between said high-frequency interconnect and said interconnect of said base substrate.

7. The semiconductor device as set forth in claim 4, wherein said electromagnetic shield layer is provided only between said high-frequency interconnect and said interconnect of said base substrate.

8. The semiconductor device as set forth in claim 1, wherein:
said base substrate has a surface on which a second electroconductive pad is provided to face said semiconductor chip; and
said electromagnetic shield layer is disposed at a same layer level as said second electroconductive pad.

9. The semiconductor device as set forth in claim 8, wherein said electromagnetic shield layer is provided only between said high-frequency interconnect and said interconnect of said base substrate.

10. The semiconductor device as set forth in claim 1, wherein said electromagnetic shield layer is formed within said interconnect layer of said semiconductor chip.

11. The semiconductor device as set forth in claim 10, wherein said electromagnetic shield layer is provided only between said high-frequency interconnect and said interconnect of said base substrate.

* * * * *